United States Patent
Neeman et al.

(10) Patent No.: US 8,638,244 B2
(45) Date of Patent: Jan. 28, 2014

(54) ENCODING MODULE, APPARATUS AND METHOD FOR DETERMINING A POSITION OF A DATA BIT WITHIN AN INTERLEAVED DATA STREAM

(75) Inventors: Yuval Neeman, Mazkeret Batya (IL); Eliya Babitsky, Caesaria (IL); Yosef Kazaz, Tel Aviv (IL)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 13/389,205

(22) PCT Filed: Aug. 31, 2009

(86) PCT No.: PCT/IB2009/053789
§ 371 (c)(1),
(2), (4) Date: Feb. 6, 2012

(87) PCT Pub. No.: WO2011/024033
PCT Pub. Date: Mar. 3, 2011

(65) Prior Publication Data
US 2012/0147988 A1      Jun. 14, 2012

(51) Int. Cl.
*H03M 7/00*       (2006.01)
(52) U.S. Cl.
USPC .............................................. 341/81; 341/51
(58) Field of Classification Search
USPC ................................ 341/81, 51; 714/701, 786
See application file for complete search history.

(56) References Cited

U.S. PATENT DOCUMENTS

| | | | | |
|---|---|---|---|---|
| 7,137,044 B2 * | 11/2006 | Ha et al. | | 714/701 |
| 7,512,843 B2 * | 3/2009 | Kim et al. | | 714/701 |
| 8,194,782 B2 * | 6/2012 | Sebeni et al. | | 375/295 |
| 8,347,196 B2 * | 1/2013 | Cheng | | 714/786 |
| 2006/0156199 A1 | 7/2006 | Palanki et al. | | |
| 2009/0207946 A1 | 8/2009 | Sebeni et al. | | |

FOREIGN PATENT DOCUMENTS

| | | |
|---|---|---|
| KR | 10-2003-0067557 A | 8/2003 |
| WO | 00-35103 A1 | 6/2000 |
| WO | 00-64073 A1 | 10/2000 |

OTHER PUBLICATIONS

IEEE, "IEEE Standard 802.16: A Technical Overview of the WirelessMAN™ Air Interface for Broadband Wireless Access" IEEE 802.16 webpage: http://www.ieee802.org/16/ Jun. 4, 2002, pp. 1-12.
International Search Report and Written Opinion correlating to PCT/IB2009/053789 dated May 28, 2010.

* cited by examiner

*Primary Examiner* — Brian Young

(57) ABSTRACT

An encoding module comprises an inverse interleaving module arranged to: determine an initial location index within an interleaving matrix for a data bit; and perform bit reverse ordering (BRO) on a column index value for the initial location index for the data bit to obtain a BRO column index value for the data bit. The inverse interleaving module is further arranged to calculate a number of valid interleaving matrix addresses preceding a location index for the data bit following bit reverse ordering; and determine a position of the data bit within the interleaved data stream based on the calculated number of valid addresses.

20 Claims, 7 Drawing Sheets

ENCODING MODULE, APPARATUS AND METHOD FOR DETERMINING A POSITION OF A DATA BIT WITHIN AN INTERLEAVED DATA STREAM

FIELD OF THE INVENTION

This invention relates to a communication unit, an encoding module and a method for determining a position of a data bit within an interleaved data stream, and more particularly to an integrated circuit comprising an inverse interleaving module arranged to determine a position of a data bit within an interleaved data stream, and a method therefore.

BACKGROUND OF THE INVENTION

Within communication systems, it is known to use channel coding to provide encryption and/or error correction for data being transmitted. For example, FIG. 1 illustrates an example of channel coding defined by IEEE 802.16 (a wireless broadband standard authored by the Institute of Electrical and Electronics Engineers). In FIG. 1, two data bit streams (A & B) 110, 120 comprising 'code blocks' of a predefined size are provided to a turbo encoder 130, which performs encoding on the data bit streams 110, 120. The turbo encoder 130 outputs six data bit streams: the two original data bit streams (A & B) 110, 120 and four generated data bit streams (Y1, Y2, W1, W2) 140, 150, 160, 170. Each of the data bit streams output by the turbo encoder 130 is then individually interleaved to generate six respective interleaved sub-blocks of data 115, 125, 145, 155, 165, 175.

Rate matching is then performed on the six interleaved sub-blocks, which comprises bit collection 180 and bit selection 190. Bit collection 180 comprises arranging the interleaved sub-blocks into one long encoded data stream, commonly referred to as a 'virtual buffer'. In particular for the example illustrated in FIG. 1, the interleaved sub-blocks are arranged as follows: the data bits from the interleaved sub-block 115 of the first original data bit stream 110; the data bits from the interleaved sub-block 125 of the second original data bit stream 120; alternating data bits from the interleaved sub-blocks 145, 155 of the first two encoded data bit streams 140, 150; and alternating data bits from the interleaved sub-blocks 165, 175 of the last two encoded data bit streams 160, 170. Bit selection 190 is then performed on the data stream within the virtual buffer for transmission. Bit selection typically comprises reading a predefined number of data bits from the virtual buffer, starting at a predefined bit. Such bit selection may implement puncturing, repetition, etc. of the data bits.

Referring now to FIG. 2, there is illustrated a known technique 200 for implementing the channel coding illustrated in FIG. 1. The technique 200 starts by loading the two data bit streams, for example (A & B) 110, 120 of FIG. 1 to be encoded into an input buffer 210. Turbo encoding is then performed on the two data bit streams (A & B) 110, 120 by turbo encoder 220. More specifically, the turbo encoding process comprises two sequences of encoding. The first encoding sequence comprises reading the two data bit streams (A & B) 110, 120 from the input buffer 210 in natural order, and feeding the read data bits into a first constituent encoder, which produces two sets of parity bits 'Y1' and 'W1'. The second encoding sequence comprises interleaving the data bit streams (A & B) 110, 120 by a Convolutional Turbo Code (CTC) interleaver, and feeding the interleaved data bits to a second constituent encoder which produces two further sets of parity bits 'Y2' and 'W2'. The data bit streams (A & B) 110, 120 are required to be stored in the input buffer 210 prior to the turbo encoding in order to allow for them to be interleaved for this second encoding sequence. The two encoding sequences may be performed simultaneously, such that the turbo encoder 220 simultaneously reads from the input buffer two natural order systematic bits (for the first encoding sequence) and two interleaved order systematic bits (for the second encoding sequence). The data bit six streams output by the turbo encoder 220 are then loaded into a middle buffer 230. Once the data bit streams have been loaded into the middle buffer 230, the sub-block interleaving may be performed on each data bit stream within the middle buffer, at 240, followed by rate matching 250. The selected bits following rate matching are then loaded into an output buffer 260.

A problem with this prior art technique for performing channel coding is that known techniques for interleaving the data streams require the entire data stream sub-block to be loaded into the middle buffer 230 in order for the interleaving to be performed. Consequently, because the bit selection process 190 may start at any bit within the virtual buffer 180, the rate matching cannot start until the turbo encoding 220 and sub-block interleaving have finished, resulting in an undesirable latency in the channel coding, and necessitating the use of the middle buffer 230.

SUMMARY OF THE INVENTION

The present invention provides an encoding module, a communication unit comprising such an encoding module, and a method for determining a position of a data bit within an interleaved data stream as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION

In the following description, the invention is described with reference to specific examples of embodiments of the invention. It will, however, be evident that various modifications and changes may be made herein without departing from the broader scope of the invention as set forth in the appended claims. For example, the invention is described herein with reference to channel coding defined by IEEE 802.16 (a wireless broadband standard authored by the Institute of Electrical and Electronics Engineers). However, examples of the invention are equally applicable within other applications involving where interleaving of blocks of data bits and the like are used.

Furthermore, because the apparatus implementing the present invention is, for the most part, composed of electronic components and circuits known to those skilled in the art, circuit details will not be explained in any greater extent than that considered necessary, as illustrated below, for the understanding and appreciation of the underlying concept of the present invention and in order not to obfuscate or distract from the teachings of the present invention.

Figure 3:
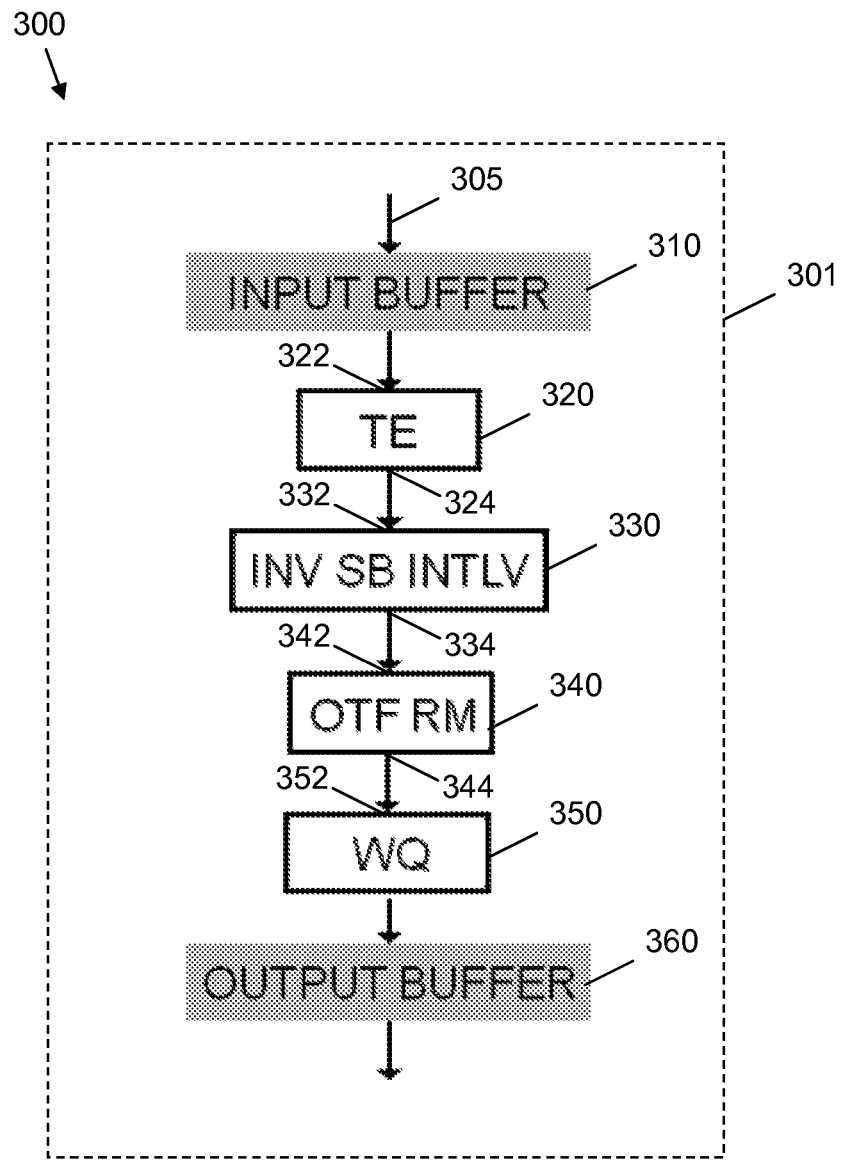
FIG. 3 illustrates a simplified block diagram of an example of a channel coding module.

Referring now to FIG. 3, there is illustrated a simplified block diagram of an example of an encoding module, which for the illustrated example is in a form of a channel coding module 300. The encoding module 300 may be implemented by way of logical hardware components within an integrated circuit 301, for example forming a part of an embedded accelerator or the like. Alternatively, it is contemplated that some or all of the components with the encoding module may be implemented by way of software or firmware.

One or more bit streams 305 comprising data to be encoded is/are loaded into an input buffer 310. The bit streams are then provided to an input 322 of, for the illustrated example, a turbo encoder 320 and encoded. The turbo encoder 320 comprises an output 324 for outputting one or more encoded data bit streams. An inverse interleaving module 330 comprises a module input 332 for receiving the one or more encoded data bit streams from the output 324 of the turbo encoder 320. The inverse interleaving module 330 is arranged to perform an inverse interleaving operation on the encoded data bits output by the encoder 320 to thereby determine the position of the encoded data bits within an interleaved data stream. An output 334 of the inverse interleaving module 330 is arranged to output the positions of the encoded data bits within the interleaved data stream, said output from the inverse interleaving module 330 being provided to an input 342 of an 'on-the-fly' rate matching module 340, which performs on-the-fly rate matching of the encoded data bits using information from the inverse interleaving module 330. An example of on-the-fly rate matching may comprise the following operation:

Let S be the size of a virtual buffer (typically equal to the code block size multiplied by, say three), such that the bits within the virtual buffer are indexed 0, 1, 2. . . , S−1. Let F be the index of the first bit to be output. Let O be the number of bits to be output by the rate matching algorithm. Let A be the index of the current bit in the virtual buffer. The following algorithm may then be used to implement puncturing (but not repetition):

```
avoiding repetition: if O > S then O = S;
if (A >= F) {
    if ((A − F) < 0) {
        write the bit to output buffer
    } else {
        Discard the bit
    }
} else {
    if ((S−F+A) < 0) {
        write the bit to output buffer
    } else {
        discard the bit
    }
}
```

An output 344 of the 'on-the-fly' rate matching module 340 provides the encoded data bits and their respective addresses to an input 352 of a write queue 350, which stores the encoded data bits at respective addresses within the output buffer 360.

Figure 1:
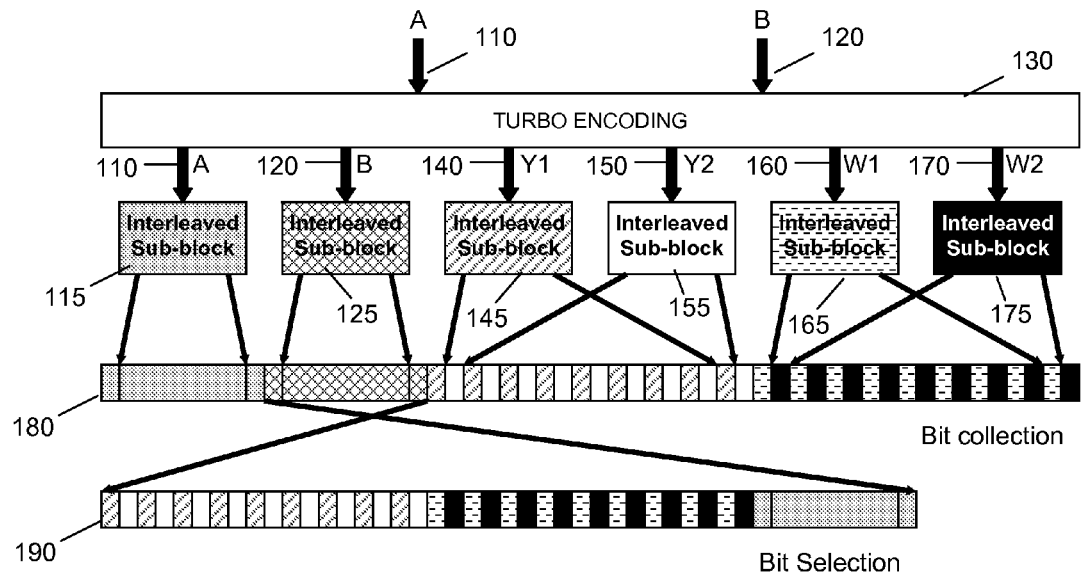
FIG. 1 illustrates an example of channel coding defined by IEEE 802.16.
Figure 2:
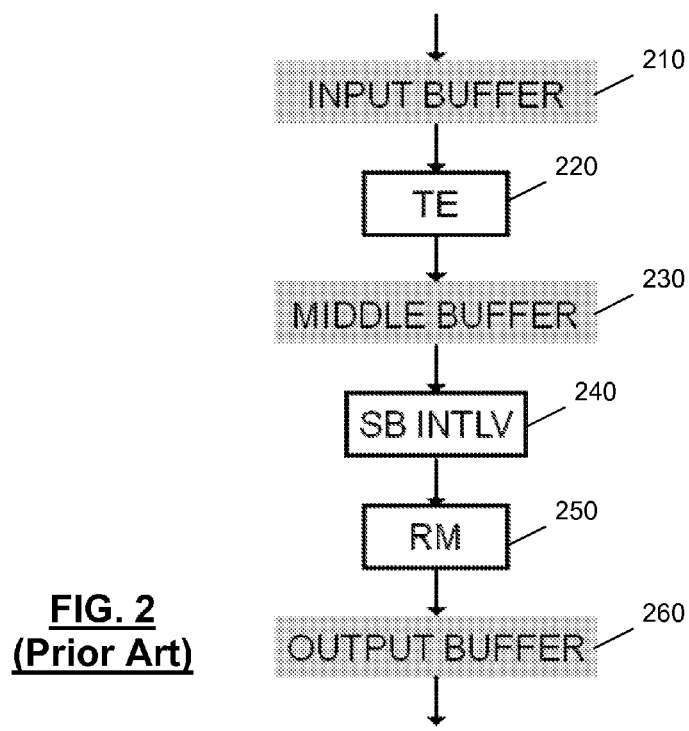
FIG. 2 illustrates a known technique for implement the channel coding illustrated in FIG. 1.

For example, in the case of IEEE802.16 channel coding, the turbo encoder 320 outputs six encoded data streams, for example as indicated at 110, 120, 140, 150, 160 and 170 in FIG. 1. For each of these encoded data streams, the inverse interleaving module 330 receives the data bits as they are output by the turbo encoder 320 and for each bit performs an inverse interleaving function to determine the position (address) of that bit of data within its respective interleaved data stream (as described in greater detail below). The inverse interleaving module 330 is then able to pass the address of that data bit within its respective interleaved data stream to the on-the-fly rate matching module 340. The on-the-fly rate matching module 340 is thus able to identify the appropriate location of the bit within the virtual buffer comprising the arranged interleaved sub-blocks based on its interleaved data stream address, and thus able to determine the respective address within the output buffer for that encoded bit.

Figure 4:
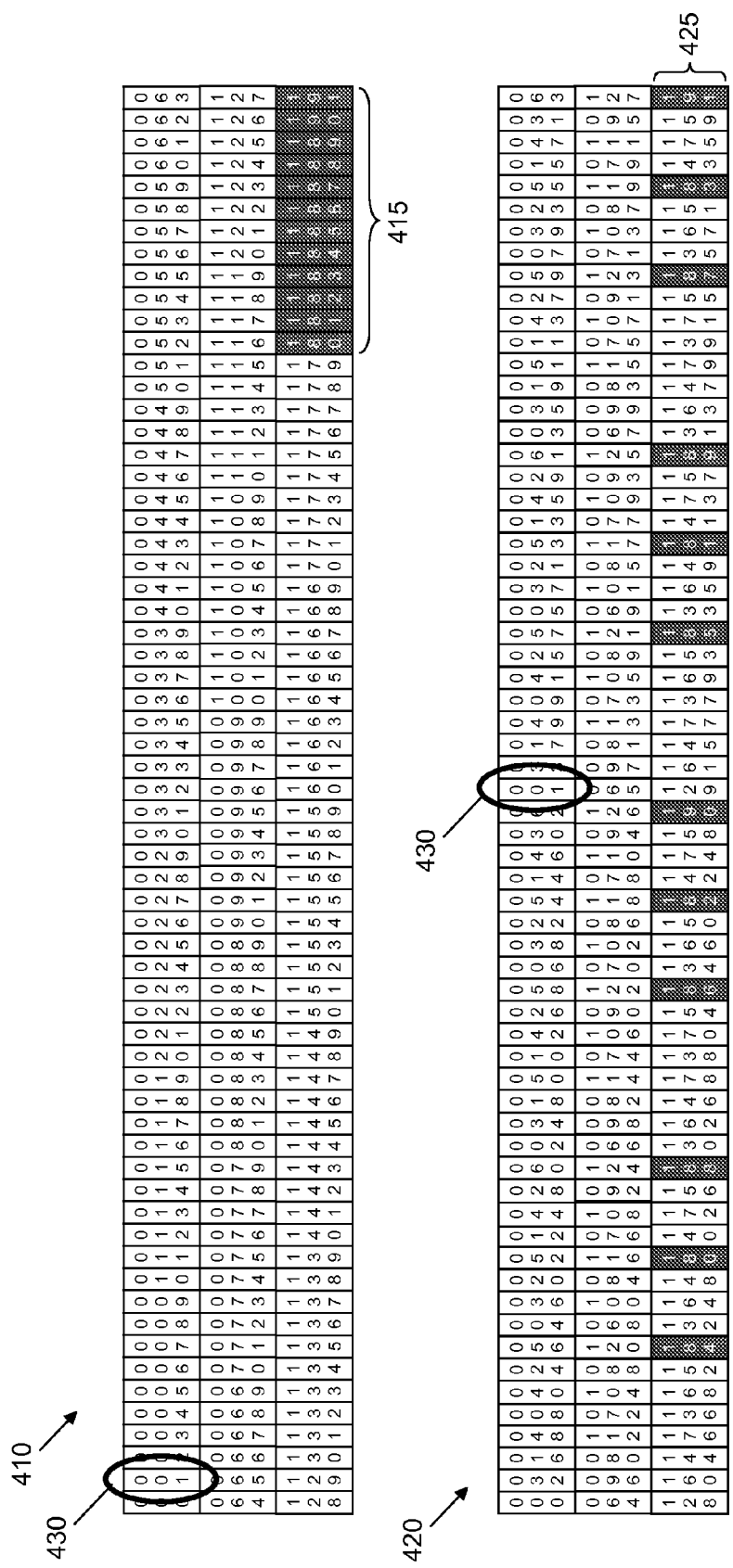
FIG. 4 illustrates an exemplary interleaving operation.

Referring now to FIG. 4 there is illustrated an interleaving operation, such as the interleaving operation implemented within IEEE802.16 channel coding. Data bits are loaded into a matrix row by row, as illustrated at 410. For the illustrated example, the matrix comprises 192 cells within 64 columns, and 3 rows. For IEEE802.16 channel coding, each bit stream comprises a code block size of 180 bits (address indexes '0' to '179'). Accordingly, for the illustrated example, the last twelve cells within the final row (addresses '180' to '191'), indicated at 415, are null/invalid. The columns of the matrix are then 'shuffled', as illustrated at 420, and the data bits are then read from the matrix column by column to create the interleaved data stream, with the invalid cells in the final row being discarded. As previously mentioned, prior art techniques utilise a middle buffer in which the complete encoded data steam is stored, for example in the form of a matrix such as that illustrated at 410. Only once the entire block of encoded data has been received is the interleaving performed.

For the example illustrated in FIG. 4, and as may be implemented with IEEE802.16 channel coding, the columns are shuffled using bit-reverse ordering. Each column comprises a column index col(i), which for the illustrated example comprises a value ranging from '0' to '63', representing its relative position within the matrix. The column index for each column is then converted into its binary value, and the order of the binary value bits are reversed such that the most significant bit becomes the least significant bit, and vice versa. The reversed bit order is then used to determine a new column index value. For the illustrated example, the matrix comprises 64 columns, thus requiring a six bit binary value to represent the column indexes. Accordingly, taking by way of example the second data bit within an encoded data stream to be interleaved, and assigning this data bit with a sequence index of '1' (the first data bit in the data stream being assigned a sequence index of '0'), this data bit will be positioned within the second column of the matrix 410, as illustrated at 430. The column index for this data bit will therefore also be '1'. Converting this column index into its six bit binary value gives '000001'. Reverse ordering this binary value gives '100000', which equates to the decimal value '32'. Accordingly, following the 'shuffling' of the columns, the data bit 430 is relocated from the second column comprising a column index value of '1' to the thirty third column comprising a column index value of '32', as illustrated at 440.

As previously mentioned, the inverse interleaving module 330 of FIG. 3 performs an inverse interleaving operation on encoded data bits output by the encoder 320 to determine the positions of the encoded data bits within an interleaved data stream. As previously mentioned with reference to FIG. 4, the interleaved data stream is traditionally created by reading the data bits from the bit reverse ordered matrix 420, in a column-by-column manner, discarding any invalid bits. In accordance with some examples, the inverse interleaving module 330 may be arranged to determine an encoded data bit's position within the bit reverse ordered matrix 420 (if such an interleaving procedure was performed), and calculate the number of preceding cells that would exist within the bit reverse ordered matrix containing valid encoded data bits to be read prior to the current encoded data bit being read when creating the interleaved data stream. In this manner, the inverse interleaving module 330 of FIG. 3 may determine the position of the encoded data bit within the interleaved data stream, substantially independent of any other encoded data bits.

For example, looking at the bit reverse ordered matrix 420 of FIG. 4, and taking the data bit with sequence index '1', illustrated at 440, as the current data bit the position of which within the interleaved data stream we wish to determine, all the preceding data bits within the interleaved data stream are located within the preceding columns of the matrix (the columns to the left of the data bit 440 in the illustrated example), and also any cells within preceding rows within the same column (rows above the data bit 440 in the illustrated example). Accordingly, the position of the current data bit 440 within the interleaved data stream may be determined by calculating the number of valid cells within the preceding columns, and within the preceding rows of the same column.

As can be seen from FIG. 4, invalid cells, illustrated as shaded cells, within the bit reverse ordered matrix 420 are only present within the last row 425 of the matrix. Accordingly, calculating the number of valid cells within all but the last row of the preceding columns is a simple matter of counting the number of cells within all but the last row of the preceding columns.

For example, the column index for a data bit, within the matrix before bit order reversing is performed, may be obtained by the function (i % 64), where 'i' is the sequence index for the data bit. Thus, for the data bit 430 of FIG. 4, the sequence index of that data bit is '1', and (1% 64)=1. Accordingly, the column index for the data bit 430 within the matrix before bit reverse ordering is performed is '1'. As mentioned above, following bit reverse ordering, the column index for the data bit 430 becomes '32', and therefore it can be determined that there are thirty two columns (columns '0' to '31') of cells that precede that of the current data bit 430 in terms of creating the interleaved data stream. Therefore, by multiplying this number by (R−1), where R is the total number of rows, the number of valid cells within all but the last row of the preceding columns can be calculated. However, in order to determine the number of valid data bits within the last row of the preceding columns, the number of invalid cells must also be taken into consideration.

Figure 5:
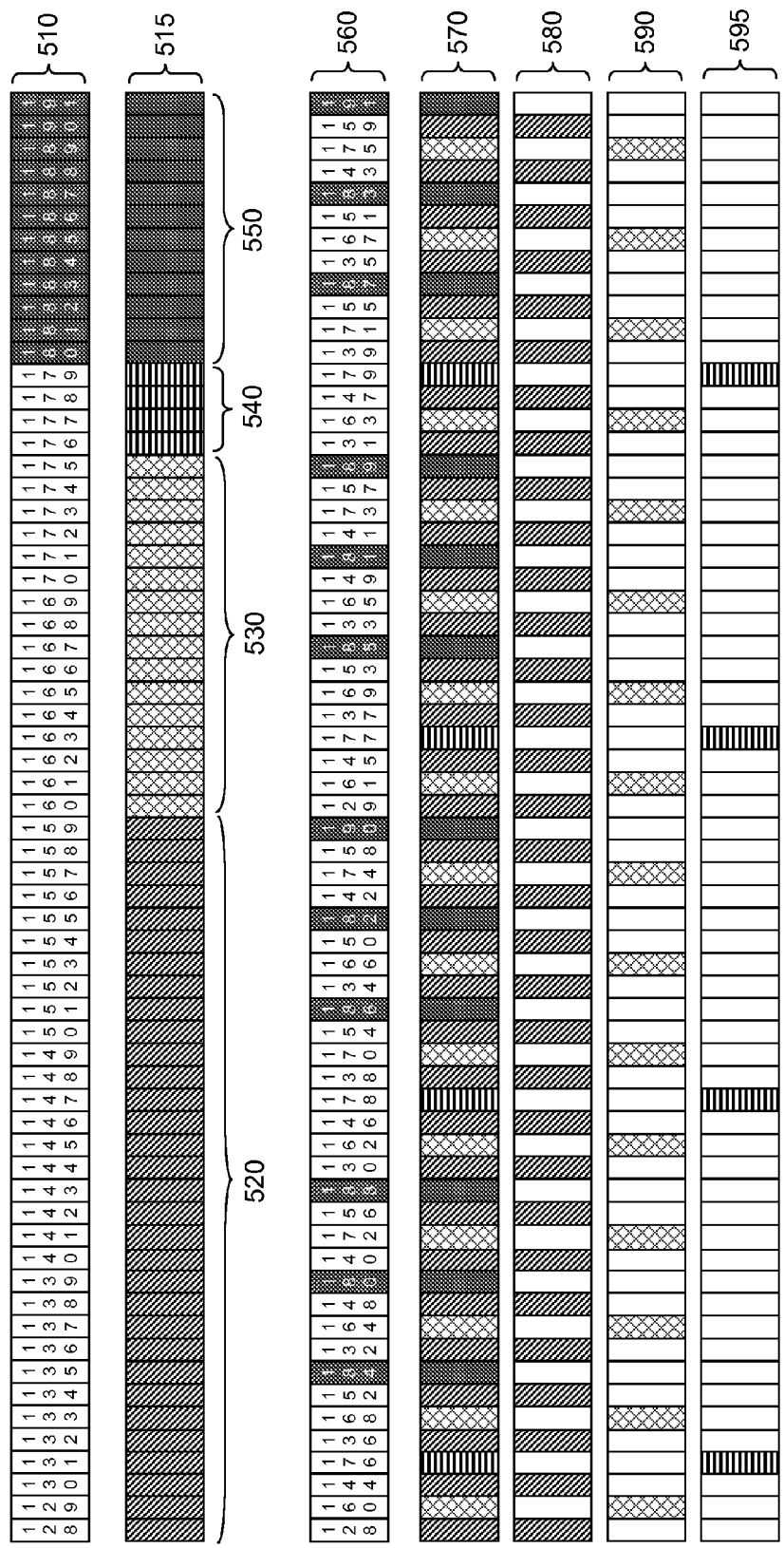
FIG. 5 illustrates an example of bit reverse ordering of cells within the last row of an interleaving matrix.

Referring now to FIG. 5, the bit reverse ordering of the cells within the last row of the interleaving matrix is illustrated in greater detail. The last row of the interleaving matrix prior to bit reverse ordering being performed (pre-BRO) is shown at 510. As previously mentioned, the matrix comprises '64' columns, with the last twelve cells of the last row within the pre-BRO matrix being invalid due to the code block size of the data stream being limited to '180' bits. Accordingly, the first '52' cells within the last row of the pre-BRO matrix comprise valid data bits. The last row of the interleaving matrix after bit reverse ordering being performed (post-BRO) is shown at 560.

The valid cells within the last row of the pre-BRO matrix 510 are divided into groups of decreasing sizes of power of two (for example, 32, 16, 8, etc.), as illustrated at 515. Since there are '52' valid cells, the first and largest group, illustrated at 520, comprises '32' cells. The second group, illustrated at 530, comprises '16' cells. Finally, since there are only four valid cells remaining, the third group comprises four cells. The remaining cells within the row are the invalid cells, and are illustrated at 550. The distribution of the groups of cells after the bit reverse ordering can be seen at 570.

For the first group of cells, the thirty two cells within the group are located within the first thirty two columns of the pre-BRO matrix, and as such comprise pre-BRO column indexes ranging from '0' to '31'. Accordingly, the binary representations for the pre-BRO column indexes of this group of cells ranges from '000000' to '011111'. Specifically, it can be seen that the most significant bit of the pre-BRO column index for all cells within this group will be '0'. Following bit reverse ordering, the binary representations of the column indexes for this group of cells will range from '000000' to '111110'. Significantly, following bit reverse ordering, the least significant bit of the column index for all cells within this group will be a '0'. As a result, the column indexes for cells within this group following bit reverse ordering will only be odd values, and in fact will be ALL the odd values, as illustrated at 580.

For the second group of cells, the sixteen cells within the group comprise pre-BRO column indexes ranging from '32' to '47'. Accordingly, the binary representations for the pre-BRO column indexes for this group of cells will range from '100000' to '101111'. Specifically, it can be seen that the two most significant bits of the pre-BRO column index for all cells within this group will be '10'. Following bit reverse ordering, the binary representations of the column indexes for this group of cells will range from '000001' to '111101'. Significantly, following bit reverse ordering, the two least significant bits of the column index for all cells within this group will be '01'. As a result, the column indexes for cells within this group following bit reverse ordering will comprise every fourth value, and more specifically the column indexes for cells within this group following bit reverse ordering will comprise the second value in each block of four cells within the row, as illustrated at 590.

For the third group of cells, the four cells within the group comprise pre-BRO column indexes ranging from '57' to '51'. Accordingly, the binary representations for the pre-BRO column indexes for this group of cells will range from '110000' to '110011'. Specifically, it can be seen that the four most significant bits of the pre-BRO column index for all cells within this group will be '1100'. Following bit reverse ordering, the binary representations of the column indexes for this group of cells will range from '110011' to '000011'. Significantly, following bit reverse ordering, the four least significant bits of the column indexes for all cells within this group will be '0011'. As a result, the column indexes for cells within this group following bit reverse ordering will comprise every sixteenth value, and more specifically the column indexes for cells within this group following bit reverse ordering will comprise the fourth value in each block of sixteen cells within the row, as illustrated at 595.

By dividing the valid cells in the last row of the matrix into groups in this manner, the number of valid cells within the last row of columns preceding a current data bit may be calculated by calculating the number of the preceding cells within each of these groups, and adding the results together; all other preceding cells being invalid.

For example, as previously explained, the column indexes for cells within the first group comprising 32 cells (32-group) comprise all the odd values, as illustrated at 580. Thus, by taking the column index of the current data bit (col(i)), the number of preceding 32-group cells ($F_{32}$) may be calculated by:

$$F_{32} = \text{col}(i) \gg 1 + (\text{col}(i) \% 2) > 0 \quad [\text{Eq. 1}]$$

where:

col(i)>>1 equals the number of 2-cell blocks in the last row preceding the current data bit column; and (col(i)% 2)>0 equals '1' when the remainder from the column index of the current data bit being divided by 2 is greater than '0', to take into account a preceding 32-group cell within the same 2-cell block as the current data bit column.

Similarly, since the column indexes for cells within the second group comprising 16 cells (16-cell group) comprise the second value in each block of four cells within the row, as illustrated at 590, the number of preceding 16-group cells ($F_{16}$) may be calculated by:

$$F_{16} = \text{col}(i) \gg 2 + (\text{col}(i) \% 4) > 1 \quad [\text{Eq. 2}]$$

where:

col(i)>>2 equals the number of 4-cell blocks in the last row preceding the current data bit column; and (col(i)% 4)>1 equals '1' when the remainder from the column index of the current data bit being divided by 4 is greater than '1', to take into account a preceding 16-group cell within the same 4-cell block as the current data bit column.

Finally, since the column indexes for cells within the third group comprising 4 cells (4-cell group) comprise the fourth value in each block of sixteen cells within the row, as illustrated at 595, the number of preceding 4-group cells ($F_4$) may be calculated by:

$$F_4 = \text{col}(i) \gg 4 + (\text{col}(i) \% 16) > 3 \quad [\text{Eq. 3}]$$

where:

col(i)>>4 equals the number of 16-cell blocks in the last row preceding the current data bit column; and (col(i)% 16)>3 equals '1' when the remainder from the column index of the current data bit being divided by 16 is greater than '3', to take into account a preceding 4-group cell within the same 16-cell block as the current data bit column.

Having calculated the total number of valid cells within the preceding columns, it is also necessary to calculate the number of valid cells within preceding rows of the same column as the current data bit. Since only rows other than the last row of the matrix can be relevant for this calculation, there is no need to take into consideration any invalid cells. Accordingly, it is only necessary to calculate the total number of rows above the current data bit. For example, a row index for the current data bit may be calculated by dividing the sequence index of the data bit by the total number of columns within the matrix, for example '64' for the illustrated embodiment, discarding any remainder of the division. For example, in the case of the data bit 430 having a sequence index of '1', dividing this value by '64' gives a row index of '0', indicating that the data bit 430 is in the top row, and thus that there are no rows above the current data bit. Thus, the number of valid cells within preceding rows of the same column as the current data bit will be equal to the row index value for the current data bit.

Figure 6:
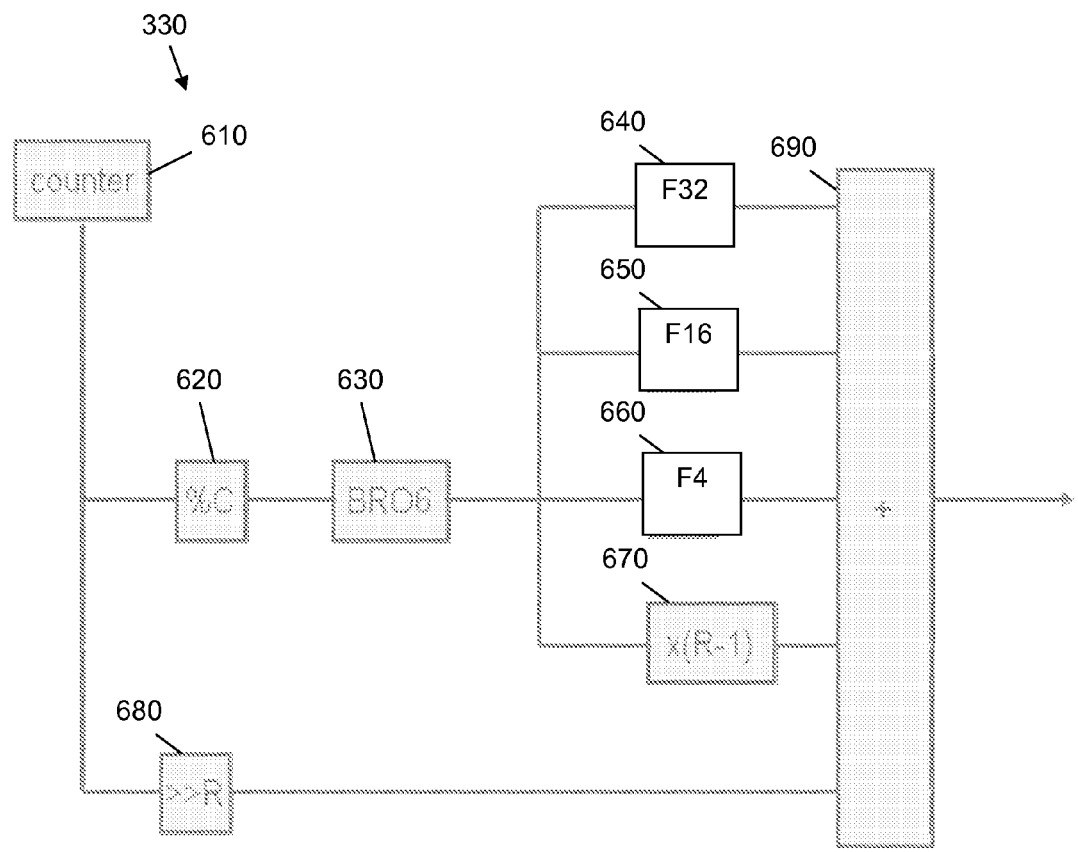
FIG. 6 illustrates an example of an implementation of an inverse interleaving module.

Referring now to FIG. 6, there is illustrated an example of an implementation of the inverse interleaving module 330 of FIG. 3. For the illustrated example, the inverse interleaving logic 330 determines the sequence index for each data bit based on an output from a counter 610 which is initialised to zero at the start of each data block to be interleaved, and incremented by one for each data bit processed. The output of the counter 610, which comprises the sequence index for the current data bit, is used to determine an initial location index within an interleaving matrix for the current data bit. In particular, the output of the counter 610 is firstly used to determine an initial column index value (i % 64) for the current data bit at 620. Next, bit reverse ordering (BRO) is performed on the initial column index value to obtain a BRO column index value for the current data bit. The BRO column index value is then used to calculate the number of 32-group cells in the preceding columns at 640, the number of 16-group cells in the preceding columns at 650, the number of 4-group cells in the preceding columns, and the total number of cells in all but the last row of the preceding columns. The results of these calculations are then provided to summing module 690. The output of the counter 610 is also used to determine a row index value (i>>R), and thus to calculate the number of cells within preceding rows of the same column. The result of this calculation is also passed to the summing module 690. The summing module 690 then adds all of the results together to calculate the number of valid interleaving matrix addresses preceding the location index for the data bit following bit reverse ordering, and from this to determine the position of the current data bit within the interleaved data stream. This information may then be output to, for example, the 'on-the-fly' rate matching module 340 of FIG. 3.

Figure 7:
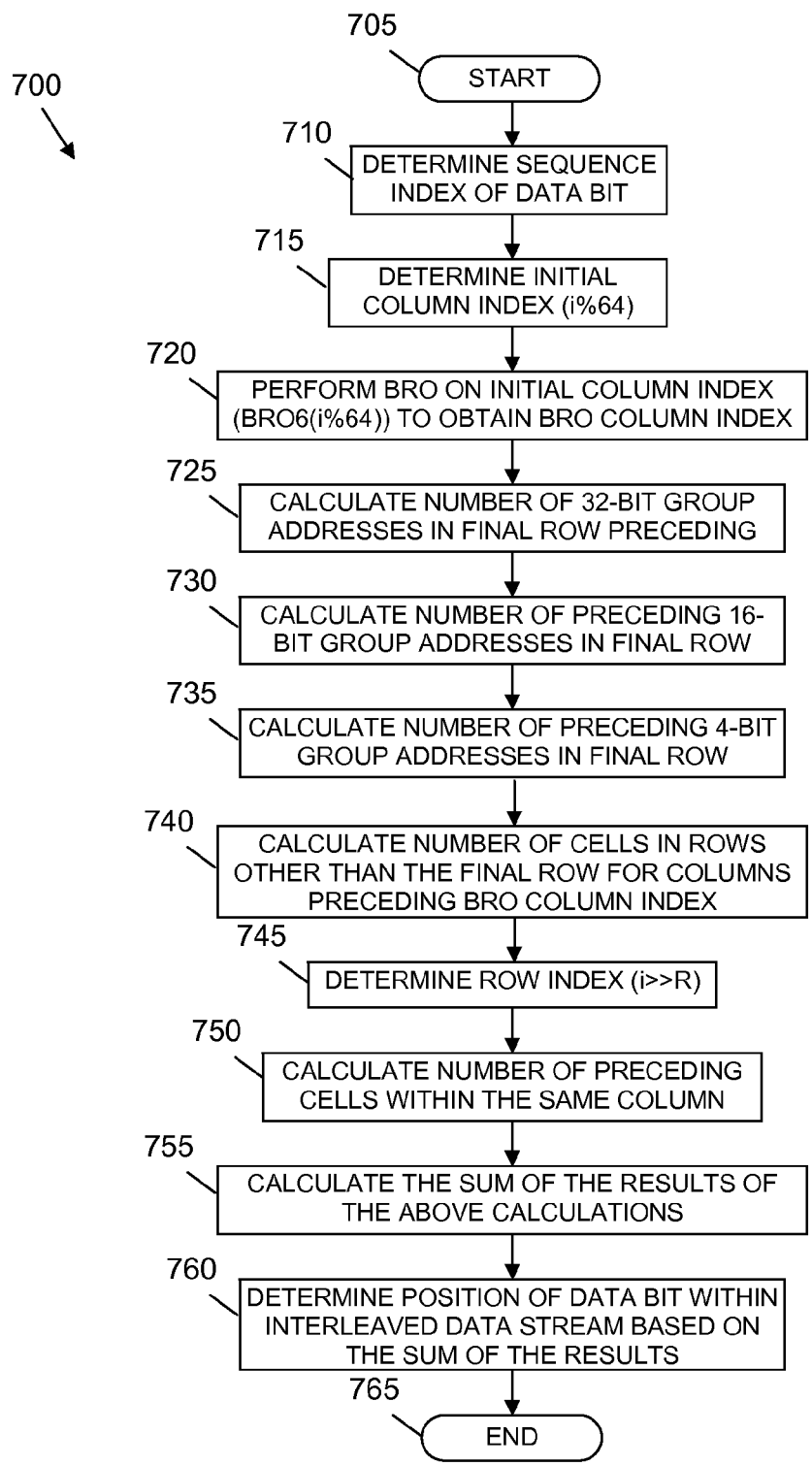
FIG. 7 illustrates a simplified flowchart of an example of a method for determining a position of a data bit within an interleaved data stream.

Referring now to FIG. 7, there is illustrated a simplified flowchart 700 of an example of a method for determining a position of a data bit within an interleaved data stream, such as may be implemented by inverse interleaving module 330 of FIG. 3 and/or inverse interleaving module 600 of FIG. 6. The method starts at step 705, and moves on to step 710 where a sequence index (i) for the particular data bit is determined. Next, in step 715, an initial column index is determined for the data bit from the sequence index, for example by way of (i % C), where C is the number of columns within an interleaving matrix. Bit reverse ordering is then performed on the initial column index, to obtain a bit reverse ordered column index value, in step 720. The bit reverse ordered column index value is then used to determine the number of valid cells within preceding columns, which for the illustrated example comprises calculating the number of preceding 32-group, 16-group and 4-group cells within the final row of the matrix, in steps 725, 730, 735, and the total number of cells in rows other than the final row of the preceding columns in step 740. Next, in step 745, a row index value for the data bit is determined, based on the sequence index, and the number of preceding cells within the same column is calculated, based on the row index value in step 750. The sum of the results of steps 725, 730, 735, 740 and 750 is then calculated in step 755, and used to determine the position of the data bit within the interleaved data stream in step 760. The method then ends at step 765.

The method illustrated in FIG. 7 may be performed for each of the data streams 110, 120, 140, 150, 160, 170 outputted by the turbo encoder 130 of FIG. 1. However, it is not necessary for there to be six instances of the inverse interleaving module 330 (i.e. one for each data stream), since the same interleaving function is used for all data streams. Accordingly, for each cycle, the inverse interleaving module 330 produces one value that may be used to determine the position of the respective data bits within each of the interleaved data streams. The bit selection algorithm may then be executed on each of the six bits for that cycle, in order to determine whether or not the bits are to be discarded. The position of up to six bits in the output buffer 360 is calculated and the bits may then be written to their respective positions within the output buffer 360.

More specifically for the example illustrated in FIG. 1, at cycle i, the encoder outputs a set of bits A, B, Y1, Y2, W1, W2. Let CBS be the code block size and I(i) be the address output by the inverse interleaving logic. The position of the encoded bits in the virtual buffer may be determined as follows:

the position of A is $I(i)$
the position of B is $(CBS/2)+I(i)$
the position of Y1 is $CBS+(2*I(i))$
the position of Y2 is $CBS+(2*I(i))+1$
the position of W1 is $2*CBS+(2*I(i))$
the position of W2 is $2*CBS+(2*I(i))+1$ Referring back to FIG. 3, the inverse interleaving module 330 hereinbefore described is able to determine the position of an encoded data bit within the interleaved data stream, substantially independently of other data bits within its data block. In this manner, the encrypted data bits output by the turbo encoder module 320 may be provided to the rate matching module 'on-the-fly' (without buffering the entire encoded block first). This has been found to reduce the latency of the channel coding by approximately 50%, thereby significantly reducing the power consumption per channel, reducing the required memory die size by approximately 40%, and simplifying the design of the channel coding module 300.

In high performance systems, the turbo encoder 320 may output more than one bit every cycle. Accordingly, the subsequent modules are required to process more than one bit every cycle as well, and multiple bits are required to be written to arbitrary addresses within the output every cycle. For example, if the turbo encoder 320 receives two sets of 'A' and 'B' data streams per cycle, and outputs two sets of A, B Y1, Y2, W1 and W2 data streams per cycle, the subsequent modules are required to process up to '12' encoded data bits per cycle, and up to '12' bits may be required to be written into the output buffer per cycle. In the case where the turbo encoder receives two sets of data streams per cycle, it will be appreciated that there is a need for two instances of the inverse interleaving logic, for example two instances of the interleaving module 330 illustrated in FIG. 6. For the first instance, the counter 610 may be initialised to 0 (zero), and arranged to count up in steps of two addresses (0, 2, 4, 6, ... ), whilst for the second instance the counter 610 may be initialised to 1, and arranged to count up in steps of two addresses (1, 3, 5, ... ). If not all of the bits can be written into memory within the same cycle the system may stall. In order to prevent stalling of the system, the write queue module 350 of the illustrated example in FIG. 3 may be implemented to handle the writing of bits to the output buffer 360 in order to prevent stalling of the inverse interleaving module 320 and the 'on-the-fly' rate matching module 340.

For example, the output buffer 360 is kept clean, whereby after a line of bits is read from the output buffer 360, that line within the buffer is overwritten with zeros. In this manner, the write queue module 350 is able to discard '0' value bits to be written to the output buffer 360, and only needs to write '1' value bits into the output buffer 360. In accordance with some examples, the output buffer 360 may be divided into four banks, implemented by way of, say, dual-port-RAM (random access memory) which allows writing two bits for each bank in every cycle, thereby allowing a maximum of eight bits to be written per cycle. In the case where there are up to twelve bits to be written to the output buffer 360 per cycle, since '0' value bits can be discarded, on average there will be only six bits per cycle to be written to the four banks of memory, two less the maximum. However, since there may be cycles in which more than eight bits are required to be written to the output buffer 360, or in which more than two bits are to be written to the same memory bank, the write queue module 350 is able to buffer any bits that cannot be stored during a cycle, and writes them to the output buffer during the next available cycle. As the average number of '1' bits to be written to the output buffer 360 is less than the capacity of the output buffer 360, the write buffer will eventually 'catch up'.

Note the above is true only if the rate matching algorithm is implementing puncturing. However if the rate matching algorithm is implementing repetition a single bit may be written to several different addresses in the output buffer. In order to overcome this, only one replica of the encoded data may be written to the output buffer and the repetition is performed by reading the data from the output buffer cyclically over and over. For example suppose there are 100 bits in the virtual buffer (ranging from 0 to 99) and the start bit is bit 35 and the rate matching algorithm is required to produce 150 bits. In this case the sequence 35, 36 ... 99, 0, 1 ... 34 will be written to output buffer. In order to get 150 bits the following sequence will be read from the output buffer: 35, 36, ... 99, 0, 1, ... 34, 35, ... 84.

Figure 8:
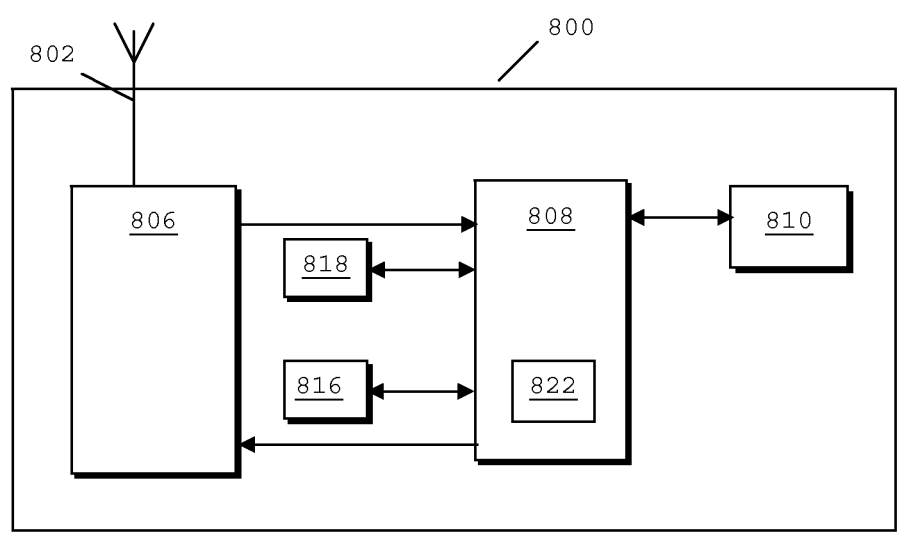
FIG. 8 illustrates an example of a simplified block diagram of part of a communication unit.

Referring now to FIG. 8, there is illustrated an example of a simplified block diagram of part of a communication unit 800. The communication unit 800, in the context of the illustrated example, is a mobile telephone handset comprising an antenna 802. As such, the communication unit 800 contains a variety of well known radio frequency components or circuits 806, operably coupled to the antenna 802 that will not be described further herein. The communication unit 800 further comprises signal processing module 808. An output from the signal processing module 808 is provided to a suitable user interface (UI) 810 comprising, for example, a display, keypad, microphone, speaker etc.

For completeness, the signal processing module 808 is coupled to a memory element 816 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 818 is typically coupled to the signal processing module 808 to control the timing of operations within the communication unit 800.

The signal processing module 808 comprises an inverse interleaving module 822 arranged to determine a position of a data bit within an interleaved data stream. The inverse interleaving module 822 may form part of a channel coding module, such as the channel coding module 300 illustrated in FIG. 3, and may comprise hardware logic, for example in a form of part of an embedded accelerator module, or may comprise software logic, for example in a form of executable code in the form of a computer program executed by the signal processing logic; for example such executable code being stored within memory element 816, and fetched by signal processing module 808 for execution thereby.

As previously mentioned, the invention may be implemented in a computer program for running on a signal processing module, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader scope of the invention as set forth in the appended claims. For example, the invention is not limited to IEEE 802.16 applications.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term 'program,' as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Of course, the description of the architecture has been simplified for purposes of discussion, and it is just one of many different types of appropriate architectures that may be used in accordance with the invention. Those skilled in the art will recognize that the boundaries between logic blocks/modules are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected' or 'operably coupled', to each other to achieve the desired functionality.

Also for example, the illustrated elements of channel coding module 300 may be located on a single integrated circuit or within a same circuit or device. Alternatively, channel coding module 300 may include any number of separate integrated circuits or separate devices interconnected with each other. For example, memory buffers 310, 360 of FIG. 3 may be located on a same integrated circuit as the other modules, or on a separate integrated circuit or located within another peripheral or slave discretely separate from other elements of channel coding module 300. Also for example, channel coding module 300 or portions thereof may be soft or code representations of physical circuitry or of logical representations convertible into physical circuitry. As such, channel coding module 300 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be embodied in communication unit 800, for example, from computer readable media such as memory 816 or other media on other computer systems. Such computer readable media may be permanently, removably or remotely coupled to an information processing system such as communication unit 800. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms 'a' or 'an'; as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An encoding module comprising:
an inverse interleaving module arranged to:
determine an initial location index within an interleaving matrix for a data bit based upon a sequence index for the data bit;
perform bit reverse ordering (BRO) on a column index value for the initial location index for the data bit to obtain a BRO column index value for the data bit;
calculate a number of valid interleaving matrix addresses preceding a location index for the data bit following bit reverse ordering; and
determine a position of the data bit within an interleaved data stream based on the calculated number of valid interleaving matrix addresses.

2. The encoding module of claim 1 wherein the inverse interleaving module is further arranged to calculate the number of valid interleaving matrix addresses preceding the location index for the data bit following bit reverse ordering by calculating a sum of:
a number of cells within all but a last row of columns preceding the column to which the BRO column index value relates;
a number of valid cells within the last row of columns preceding the column to which the BRO column index value relates; and
a number of preceding cells within the column to which the BRO column index, value relates.

3. The encoding module of claim 2 wherein the inverse interleaving module is further arranged to calculate the number of valid cells within the last row of columns preceding the column to which the BRO column index value relates by segregating the valid cells within the last row of the matrix following bit reverse ordering into groups of decreasing sizes of power of two, and calculating the number of preceding cells within each of these groups.

4. The encoding module of claim 1 wherein the encoding module comprises a channel coding module, and the inverse interleaving module is arranged to output to an on-the-fly rate matching module information relating to positions of data bits within the interleaved data stream.

5. The encoding module of claim 4 wherein the channel coding module is arranged to perform channel coding according to IEEE 802.16.

6. The encoding module of claim 1 wherein the inverse interleaving module forms a part of an embedded accelerator module.

7. An integrated circuit comprising an encoding module, wherein the encoding module comprises:
an inverse interleaving module arranged to:
determine an initial location index within an interleaving matrix for a data bit;
perform bit reverse ordering (BRO) on a column index value for the initial location index for the data bit to obtain a BRO column index value for the data bit;
calculate a number of valid interleaving matrix addresses preceding a location index for the data bit following bit reverse ordering by calculating a sum of:
a number of cells within all but a last row of columns preceding column to which the BRO column index value relates;
a number of valid cells within the last row of columns preceding the column to which the BRO column index value relates; and
a number of preceding cells within the column to which the BRO column index value relates; and
determine a position on the data bit within an interleaved data stream based on the calculated number of valid interleaving matrix addresses.

8. A communication unit comprising:
an on-the-fly rate matching module; and
an encoding module, wherein the encoding module comprises:
a channel coding module; and
an inverse interleaving module arranged to:
determine an initial location index within an interleaving matrix for a data bit;
perform bit reverse ordering (BRO) on a column index value for the initial location index for the data bit to obtain a BRO column index value for the data bit;
calculate a number of valid interleaving matrix addresses preceding a location index for the data bit following bit reverse ordering;
determine a position of the data bit within an interleaved data stream based on the calculated number of valid interleaving matrix addresses: and
output to the on-the-fly rate matching module information relating to positions of data bits within the interleaved data stream.

9. The integrated circuit of claim 7 wherein the inverse interleaving module is further arranged to determine the initial location index within the interleaving matrix for the data bit based upon a sequence index for the data bit.

10. The integrated circuit of claim 7 wherein the inverse interleaving module is further arranged to calculate the number of valid cells within the last row of columns preceding the column to which the BRO column index value relates by segregating the valid cells within the last row of the matrix following bit reverse ordering into groups of decreasing sizes of power of two, and calculating the number of preceding cells within each of these groups.

11. The integrated circuit of claim 7 wherein the encoding module comprises a channel coding module, and inverse interleaving module is arranged to output to an on-the-fly rate matching module information relating to positions of data bits within the interleaved data stream.

12. The integrated circuit of claim 11 wherein the channel coding module is arranged to perform channel coding according to IEEE 802.16.

13. The integrated circuit of claim 7 wherein the inverse interleaving module forms a part of an embedded accelerator module.

14. The communication unit of claim 8 wherein the inverse interleaving module is further arranged to calculate a number of valid interleaving matrix addresses preceding the location index for the data bit following bit reverse ordering by calculating a sum of:
a number of cells within all but a last row of columns preceding the column to which the BRO column index value relates;
a number of valid cells within the last row of columns preceding the column to which the BRO column index value relates; and
a number of preceding cells within the column to which the BRO column index value relates.

15. The communication unit of claim 14 wherein the inverse interleaving module is further arranged to calculate the number of valid cells within the last row of columns preceding the column to which the BRO column index value relates by segregating the valid cells within the last row of the matrix following bit reverse ordering into groups of decreasing sizes of power of two, and calculating the number of preceding cells within each of these groups.

16. The communication unit of claim 8 wherein the channel coding module is arranged to perform channel coding according to IEEE 802.16.

17. The communication unit of claim 8 wherein the inverse interleaving module forms a part of an embedded accelerator module.

18. The encoding module of claim 1 arranged to output more than one bit per cycle.

19. The encoding module of claim 18 wherein:
the inverse interleaving module is further arranged to output a set of data bits A, B, Y1, Y2, W1, and W2 at each cycle, wherein data bit A is from a first original data bit stream, data bit B is from a second original data bit stream, and data bits Y1, Y2, W1, and W2 are from four generated data bit streams; and
to determine a position within the inverse interleaving matrix for a data bit during a cycle with cycle index i comprises applying two or more formulas comprising:
a position of data bit B is (CBS/2) +1(i);
a position of data bit Y1 is CBS +(2*1(i));
a position of data bit Y2 is CBS +(2*1(i)) +1;
a position of data bit W1 is 2 *CBS +(2*1(i)); and
a position of data bit W2 is 2 *CBS +(2*1(i)) +1, where CBS is a code block size of the data streams and 1(i) is a position of data bit A within the interleaved data stream.

20. The communication unit of claim 8 wherein the initial location index within the interleaving matrix for the data bit is based upon a sequence index for the data bit.

* * * * *